United States Patent
Park et al.

(10) Patent No.: US 10,208,939 B2
(45) Date of Patent: Feb. 19, 2019

(54) LIGHTING APPARATUS

(71) Applicant: LG INNOTEK CO., LTD., Seoul (KR)

(72) Inventors: Jin Gyeong Park, Seoul (KR); Won Jin Kim, Seoul (KR); In Jae Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/488,621

(22) Filed: Apr. 17, 2017

(65) Prior Publication Data
US 2017/0299142 A1    Oct. 19, 2017

(30) Foreign Application Priority Data
Apr. 18, 2016  (KR) .................. 10-2016-0047002

(51) Int. Cl.
| | |
|---|---|
| F21V 29/89 | (2015.01) |
| F21V 29/502 | (2015.01) |
| F21V 29/70 | (2015.01) |
| F21V 7/04 | (2006.01) |
| F21V 9/06 | (2018.01) |
| F21K 9/64 | (2016.01) |
| F21S 41/14 | (2018.01) |

(Continued)

(52) U.S. Cl.
CPC .............. *F21V 29/502* (2015.01); *F21K 9/64* (2016.08); *F21S 41/14* (2018.01); *F21S 45/47* (2018.01); *F21V 7/04* (2013.01); *F21V 9/06* (2013.01); *F21V 9/30* (2018.02); *F21V 29/70* (2015.01); *F21V 29/745* (2015.01); *F21V 29/89* (2015.01); *F21V 13/12* (2013.01); *F21V 29/74* (2015.01); *F21Y 2113/00* (2013.01)

(58) Field of Classification Search
None
See application file for complete search history.

(56) References Cited

U.S. PATENT DOCUMENTS

| | | | |
|---|---|---|---|
| 9,874,741 B2 * | 1/2018 | Egawa | G03B 21/204 |
| 2008/0123339 A1 | 5/2008 | Bierhuizen et al. | |

(Continued)

FOREIGN PATENT DOCUMENTS

| | | |
|---|---|---|
| DE | 10 2012 100140 A1 | 7/2013 |
| JP | 2015 005633 A | 1/2015 |

(Continued)

OTHER PUBLICATIONS

EPO Office Action for European Patent Application No. 17166686.0 dated Sep. 28, 2017 which corresponds to the above-referenced U.S. application.

*Primary Examiner* — Elmito Breval
(74) *Attorney, Agent, or Firm* — LRK Patent Law Firm

(57) ABSTRACT

A lighting apparatus which is improved in terms of a light distribution property and a performance of radiating heat includes: a light source which generates laser light; a light conversion unit which is disposed in a direction that the laser light is emitted, and includes a phosphor layer that generates a converted light which is excited by the laser light; and a housing which covers a side surface of the phosphor layer, and is disposed on a light emitting surface of the light conversion unit, wherein the housing includes an opening which exposes a first surface of the phosphor layer, and a plurality of slits.

20 Claims, 6 Drawing Sheets

(51) Int. Cl.
  *F21S 45/47*  (2018.01)
  *F21V 9/30*   (2018.01)
  *F21V 13/12*  (2006.01)
  *F21Y 113/00* (2016.01)
  *F21V 29/74*  (2015.01)

(56) References Cited

U.S. PATENT DOCUMENTS

| | | |
|---|---|---|
| 2012/0057325 A1 | 3/2012 | Hikmet |
| 2012/0188518 A1 | 7/2012 | Mukouyama et al. |
| 2013/0250248 A1 | 9/2013 | Ogura |
| 2014/0293631 A1 | 10/2014 | Lee |

FOREIGN PATENT DOCUMENTS

| | | |
|---|---|---|
| WO | 2012108291 A1 | 8/2012 |
| WO | 2017043121 A1 | 3/2017 |

* cited by examiner

LIGHTING APPARATUS

CROSS-REFERENCE TO RELATED APPLICATION

This application claims priority to and the benefit of Korean Patent Application No. 10-2016-0047002, filed on Apr. 18, 2016, the disclosure of which is incorporated herein by reference in its entirety.

BACKGROUND

1. Field of the Invention

Embodiments of the present invention are related to a lighting apparatus, specifically a lighting apparatus which can be used in a lamp for vehicles.

2. Discussion of Related Art

Recently, as the market of electric vehicles and hybrid electrics vehicle has expanded, there has been active development of low-power and high-efficiency light sources, which do not use a filament, for vehicles.

However, since a low-power and high-efficiency light source uses a low-wavelength light source which is emitted with a spectrum having relatively narrow width, it is necessary to convert a light emitted from the light source to white light using a phosphor. In addition, during such converting process, reliability problem may occur since the phosphor is deteriorated and degenerated by high-temperature and/or high-density low-wavelength light.

To solve problems as mentioned above, the need for a lighting apparatus which is able to dispose a light source and a phosphor spaced apart from each other has come to be needed. The phosphor has advantageous for improving reliability. However, the converted light by the phosphor is emitted in all directions, so light efficiency is reduced. So, it is necessary that the problem in regards to light efficiency becomes resolved. Further, when disposing the light source and the phosphor to be increasingly spaced apart to radiate heat, there is a limitation in terms of miniaturizing the lighting apparatus.

SUMMARY OF THE INVENTION

Embodiments of the present invention provide a lighting apparatus improved in terms of a light distribution adjusting feature and the performance of radiation of heat.

A lighting apparatus according to an embodiment of the present invention comprises: a light source which generates a laser light; a light conversion unit which is disposed in a direction that the laser light is emitted, and includes a phosphor layer that generates a converted light which is excited by the laser light; and a housing which covers a side surface of the phosphor layer, and is disposed on a light emitting surface of the light conversion unit, wherein the housing includes an opening which exposes a first surface of the phosphor layer, and a plurality of slits.

The lighting apparatus of the present invention includes the housing for adjusting light distribution. Accordingly, it may possible to remove a collimator and a light concentrating unit. Also, the housing includes a plurality of slits, it is able to improve performance of radiation of heat through the housing. So, it may be possible to achieve the miniaturization of the lighting apparatus and reduce manufacturing cost by disposing the light source and the light conversion unit closely.

BRIEF DESCRIPTION OF THE DRAWINGS

The aforementioned matter and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Figure 1:
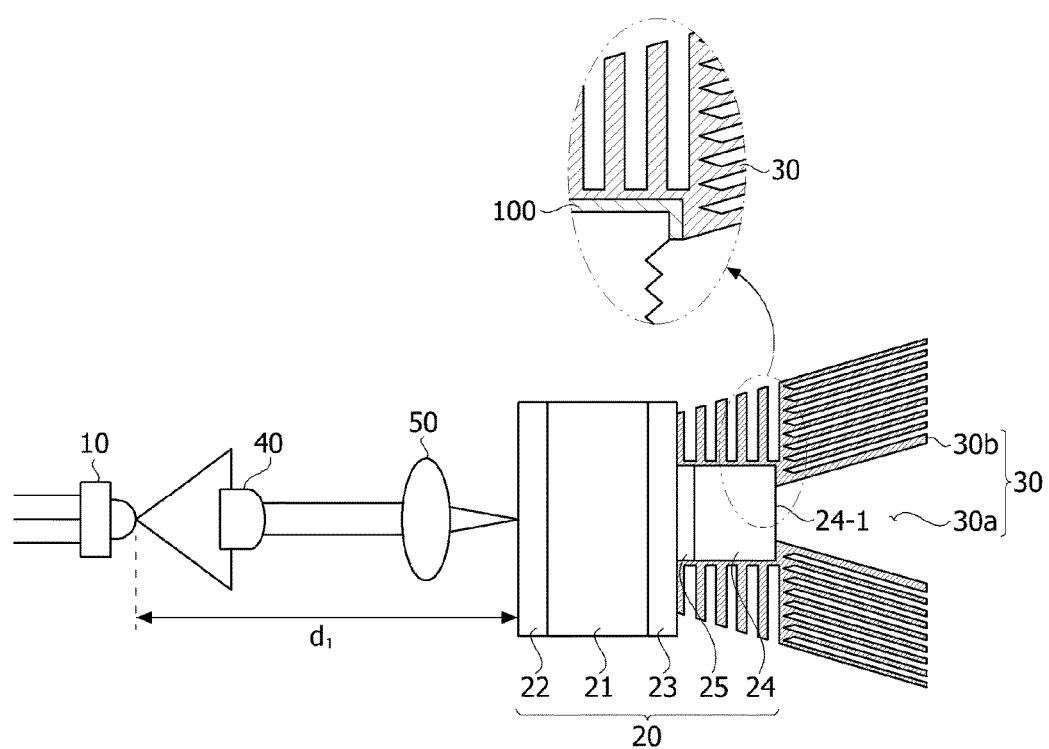
FIG. 1 is a cross sectional view of a lighting apparatus according to a first embodiment of the present invention.

While the invention can allow various modifications and alternative embodiments, specific embodiments thereof are shown by way of example in the drawings and will be described. However, it should be understood that there is no intention to limit the invention to the particular embodiments disclosed, but on the contrary, the invention is to cover all modifications, equivalents, and alternatives falling within the spirit and scope of the invention.

It will be understood that although the terms including ordinal numbers such as "first," "second," etc. may be used herein to describe various elements, these elements are not limited by these terms. These terms are used to distinguish one element from another. For example, a second element could be termed a first element without departing from the teachings of the present inventive concept, and similarly a first element could be also termed a second element. The term "and/or" includes any and all combination of one or more of the related listed items.

When an element is referred to as being "connected to" or "coupled with" another element, not only it can be directly connected or coupled to the other element, but also it can be understood that intervening elements may be present. In contrast, when an element is referred to as being "directly connected to" or "directly coupled with" another element, there are no intervening elements present.

The terminology used herein is for the purpose of describing particular embodiments only and is not intended to limit the present inventive concept. As used herein, the singular forms "a," "an," and "the," are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the present invention will be described in detail with reference to the accompanying drawings, and regardless of the numbers in the drawings, the same or corresponding elements will be assigned with the same numbers and overlapping descriptions will be omitted.

Hereinafter, a lighting apparatus according to embodiments of the present invention will be explained in detail by referring to accompanying drawings.

FIG. 1 is a cross sectional view of a lighting apparatus according to an embodiment of the present invention.

As shown in FIG. 1, the lighting apparatus according to an embodiment of the present invention comprises: a light source 10; a light conversion unit 20 which is disposed in a direction that the light emitted from the light source 10 travels and converts the light emitted from the light source 10; and a housing 30 which is disposed on a light emitting surface and includes an opening 30a from which the light that passes through the light conversion unit is emitted, wherein the housing 30 includes a plurality of slits 30b. Here, the light emitting surface refers to a surface from which a light is emitted, and it may also refer to an area of the light conversion unit 20 which is disposed on the opposite side of the light source 10.

The light source 10 may generate a laser light which has a wavelength of blue light. The laser light generated in the light source 10 may have wavelength about 450 nm.

The light conversion unit 20 is disposed in a direction in which the laser light is emitted. The light conversion unit 20 includes a phosphor layer 24, so as to be able to output white light through the opening 30a of the housing. The light conversion unit 20 may transmit some part of the laser light emitted from the light source 10. The light conversion unit 20 may absorb the other part of the laser light emitted from the light source 10 so as to convert a converted light. Here, a transmitted light by the light conversion unit 20 has the wavelength of blue light. The converted light by the light conversion unit 20 has a wavelength of yellow light. The light which has the wavelength of blue light and the light which has the wavelength of yellow light are emitted from the light emitting surface of the light conversion unit 20. They may be mixed with each other and form white light.

The light conversion unit 20 may include a substrate 21, an antireflection coating 22, a short wavelength filter 23 and a phosphor layer 24.

The substrate 21 may include, but not be limited to, sapphires. The substrate 21 may offer a function of radiation of heat. For example, the heat may be generated when the light passes through the light conversion unit 20 or the light source 10 operating. The heat may be transferred or released by the substrate 21.

The antireflection coating 22 may be coated on a backside of the substrate 21. In this case, the antireflection coating 22 may be disposed to face the light source 10. Thus, when the light emitted from the light source 10 is incident on the substrate 21, the antireflection coating 22 may prevent the light from being reflecting on the surface of the substrate 21, and maximize an amount of incident light on the substrate.

The short wavelength filter 23 is disposed on the front surface of the substrate 21, and the short wavelength filter 23 is for blocking light which has a particular wavelength band. For instance, the short wavelength filter 23 may block a light which has a wavelength above 500 nm. The short wavelength filter 23 may be provided between the substrate 21 and the phosphor layer 24. The short wavelength filter 23 may reflect a part of the converted white light in the phosphor layer which travels in a direction towards the substrate 21, not towards the first surface 24-1. The short wavelength filter 23 may reflect a part of the converted white light in the phosphor layer in a direction towards a first surface 24-1.

The phosphor layer 24 may be provided on a surface which is in contact with the housing 30. The phosphor layer 24 may transmit or absorb an incident light. The phosphor layer 24 may convert an absorbed light to a light which has a different wavelength. And then the phosphor layer 24 may emit the converted light. The phosphor layer 24 converts the absorbed light to a light which has the wavelength of yellow light. And the converted light forms a white light by being combined with laser light which has the wavelength of blue light. Here, the laser light which has the wavelength of blue light is the transmitted light from the phosphor layer 24. Between the phosphor layer 24 and the short wavelength filter 23, a bonding layer 25 is further disposed, and thus the bonding layer 25 may enhance adhesion between the short wavelength filter 23 and the phosphor layer 24.

The housing 30 is connected to the light conversion unit 20 at the light emitting surface, and may include the opening 30a which exposes the first surface 24-1 of the phosphor layer 24. For example, the opening 30a exposes a part of the phosphor layer 24, and the white light may be emitted through the opening 30a. Particularly, an area which is exposed through the opening 30a may be a part of the first surface 24-1. Here, the first surface 24-1 may be a surface of the phosphor layer 24, which is disposed on the opposite side of the light source 10. Further, the first surface 24-1 may correspond to the light emitting surface of the light conversion unit 20.

Figure 2:
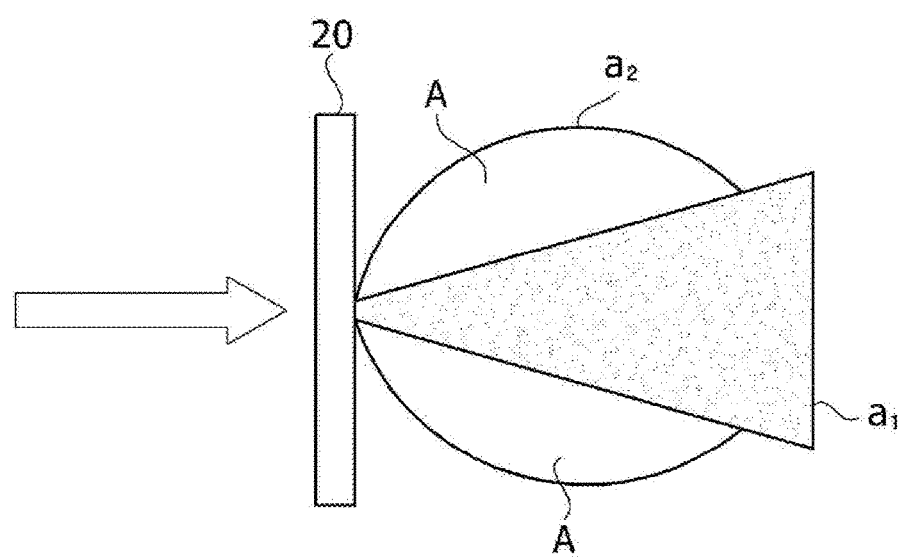
FIG. 2 is a cross sectional view showing a light-emitting of a general lighting apparatus.

FIG. 2 is a cross sectional view showing a light-emitting of a general lighting apparatus.

As shown in FIG. 2, the laser lights emitted from the light source (referred to as "10" in FIG. 1) incidents on the light conversion unit 20. The laser lights have the wavelength of blue light. Some part of the laser lights transmitted through the light conversion unit 20 forms an area of light distribution a1 according to Gaussian distribution. And the other part of the laser light converted by the phosphor layer (referred to as "24" in FIG. 1) forms an area of light distribution a2 according to Lambertian distribution.

That is, the white light is formed in an area in which the laser light which has the wavelength of blue light according to Gaussian distribution and the wavelength of yellow light according to Lambertian distribution overlap with each other; however, the light which has the wavelength of yellow light is emitted as it is in an area A which is out of the Gaussian distribution. This light which has the wavelength of yellow light increases the overall deviation in colors in the light emitted from the lighting apparatus and generates yellow-based light in the vicinity of the white light.

Accordingly, referring to FIG. 1 again, the lighting apparatus according to embodiments of the present invention may be formed with a structure in which the opening 30a of the housing 30 is inclined so as to have a tilting angle θ which is 90° or less with respect to the first surface 24-1. That is, the opening 30a of the housing 30 may be increasingly widened as the distance from the first surface 24-1 of the phosphor layer 24 increases. Further, the housing 30 is placed so as to surround a part of the first surface 24-1 of the phosphor layer 24 with the exception of the opening 30a and also a side surface of the phosphor layer 24.

In this case, the housing 30 may include a material which has good thermal conductivity such as Al, Cu, and the like for radiating heat. For example, the housing 30 may be a heat sink.

When the light emitted from the light source passes through the light conversion unit 20 or when the light source 10 is operated, heat is generated. Thus, as described above, the substrate 21 which includes sapphires may be placed for radiating heat. However, since the substrate 21 is disposed between the phosphor layer 24 and the light source 10, a function of radiation of heat which is generated in the vicinity of the phosphor layer 24 may be deteriorated. Further, since the light is also emitted not only from the first surface 24-1, but also from the side surface, it is preferred to shield the side surface of the phosphor layer 24 to increase the amount of light emitted through the opening 30a.

For this purpose, the general lighting apparatus has a white molding, which includes white silicon, on the side surface of the phosphor layer 24. Here, since the white silicon is an organic material in which silicon resin, $TiO_2$, and the like are mixed together, it has lower thermal stability and reliability than a metal. Furthermore, since it is necessary to implement a process in which the white silicon is applied to surround the side surface of the phosphor layer and then hardened. So, the process may be complicated, and before hardening of the white silicon, the white silicon may flow down and may cause defects.

On the contrary, in the embodiments of the present invention, the housing 30 may be disposed to surround a part of the first surface 24-1 and also a side surface of the phosphor layer 24 so as to be connected to the light conversion unit 20. In this case, the housing 30 may consist of a metal material that has excellent heat conductivity for radiating heat. In other words, the housing 30 is formed as an integral type housing that covers the part of the first surface 24-1 and also a side surface of the phosphor layer 24, so that the aforementioned white molding could be removed. Moreover, since the housing 30 includes metal materials, it may be possible to easily reflect the light which is emitted through the side surface of the phosphor layer 24 and to travel it to the opening 30a.

In addition, the housing 30 may include a plurality of slits 30b for radiating heat. The plurality of slits 30b may be disposed to surround a part of the first surface 24-1 and also a side surface of the phosphor layer 24. Furthermore, the plurality of slits 30b may be extended from a part of the first surface 24-1 and a side surface of the phosphor layer 24 to a direction which extends away from the phosphor layer 24.

On one hand, an area of the phosphor layer 24 where the slit 30b is not disposed may refer to the opening 30a of the housing. That is, since the slit 30b is not disposed in the opening 30a, a part of the first surface 24-1 of the phosphor layer 24 may be exposed to the outside. In addition, the opening 30a may be surrounded by the slits 30b. That is, the opening 30a may be an area which consists of the exposed part of the first surface 24-1 and a side surface of the slit 30b.

The slit 30b increases an area of the lighting apparatus where heat can be released, thereby improving heat releasing efficiency. In the drawings, although the plurality of slits are shown in a straight form, the slits may have a curved form to increase an heat releasing area, and thus the form of the slits is not limited thereto.

To enhance the connecting force between the housing 30 and the light conversion unit 20, a metal paste 100 which is comprised of a conductive adhesive material may be formed on an interface between the housing 30 and the phosphor layer 24. That is, after forming the metal paste 100 such as Ag, Cu, and the like on an inner surface of the housing 30, the housing 30 and the light conversion unit 20 may be fastened. In this case, due to the metal paste 100, not only the fastening force but also the light reflection efficiency at the side surface of the phosphor layer 24 will be further improved.

The first surface 24-1 of the phosphor layer 24 which is exposed through the opening 30a of the housing has a different roughness average (Ra) from the surface of the phosphor layer 24 which is closely disposed on the housing 30. For example, on an area which is exposed through the opening 30a of the housing 30 on the first surface 24-1 of the phosphor layer 24, an uneven structure 24a may be formed. The roughness average of the first surface 24-1 on which the uneven structure 24a is formed is greater than that of the surface (for example, a side surface) which is closely disposed on the housing 30. The roughness average (Ra) of the uneven structure 24a may be 0.05 μm or less, and the numerical value is not limited thereto.

Thus, the diffusion and scattering effect of the light which is emitted from the opening is improved by the uneven structure 24a, and the adhesion between the housing 30 and the phosphor layer 24 may be improved.

In addition, a collimator 40 and a light concentrating unit 50 may be further disposed between the light source 10 and the light conversion unit 20. In this case, the collimator 40 is disposed closer to the light source 10 than the light concentrating unit 50.

The collimator 40 emits a laser light which is emitted from the light source 10 as a parallel light, and the light concentrating unit 50 concentrates the parallel light which is emitted through the collimator 40. The light concentrating unit 40 may refract the laser light which passes through the collimator 40 and then allow the refracted laser light to be incident on the light conversion unit 20. The light concentrating unit 50 may consist of a condensing lens, and it may refract the laser light which is incident as a parallel light toward the center of the light conversion unit 20 and allow the laser light to be incident on the light conversion unit 20.

Figure 3:
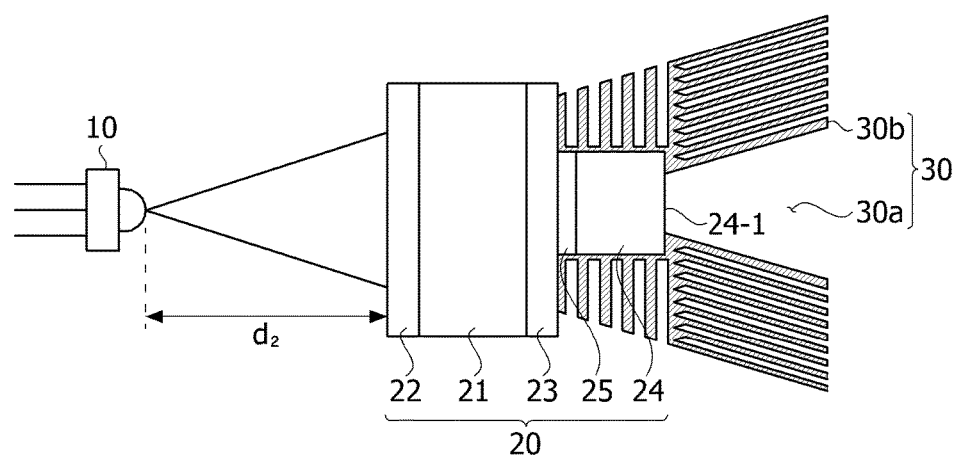
FIG. 3 is a cross sectional view of a lighting apparatus according to a second embodiment of the present invention.

FIG. 3 is a cross sectional view of a lighting apparatus according to a second embodiment of the present invention.

As shown in FIG. 3, a lighting apparatus according to the second embodiment of the present invention may be dispensed with the collimator 40 and the light concentrating unit 50, and thus it may be possible to achieve making the lighting apparatus thinner by making a distance d2 between the light source 10 and the light conversion unit 20 shorter than a distance d1 between the light source 10 and the light conversion unit 20 in FIG. 1.

In general, if the distance between the light source 10 and the light conversion unit 20 is too close, it is difficult to radiate heat which is generated by operation of the light source 10 by using only the substrate 10. However, as described above, since the embodiment of the present invention, the housing 30 includes a plurality of slits 30b, the performance of radiation of heat may be improved even if the light source 10 is disposed adjacent to the light conversion unit 20. Accordingly, by removing the collimator 40 and the light concentrating unit 50, it may be possible to realize the miniaturization of the lighting apparatus and reduce the manufacturing costs.

Figure 4A:
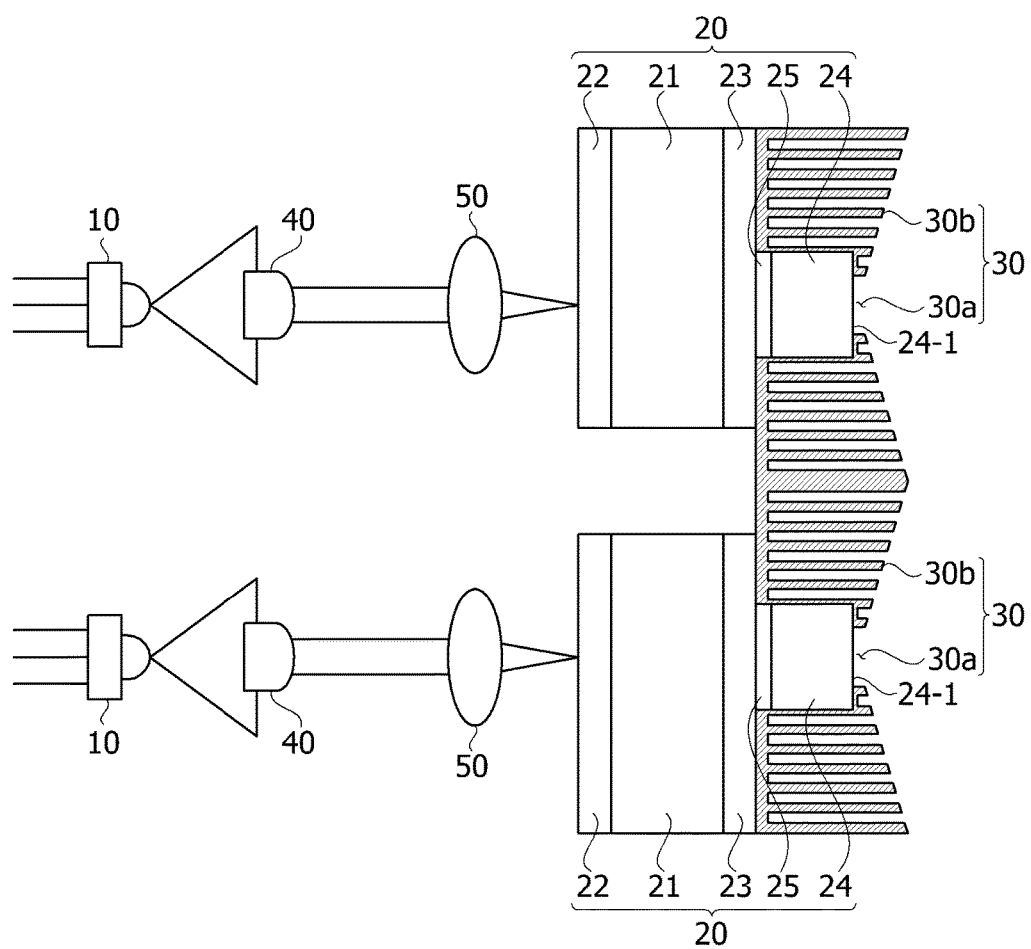
FIGS. 4A to 4C are cross sectional views of a lighting apparatus according to a third embodiment of the present invention.
Figure 4B:
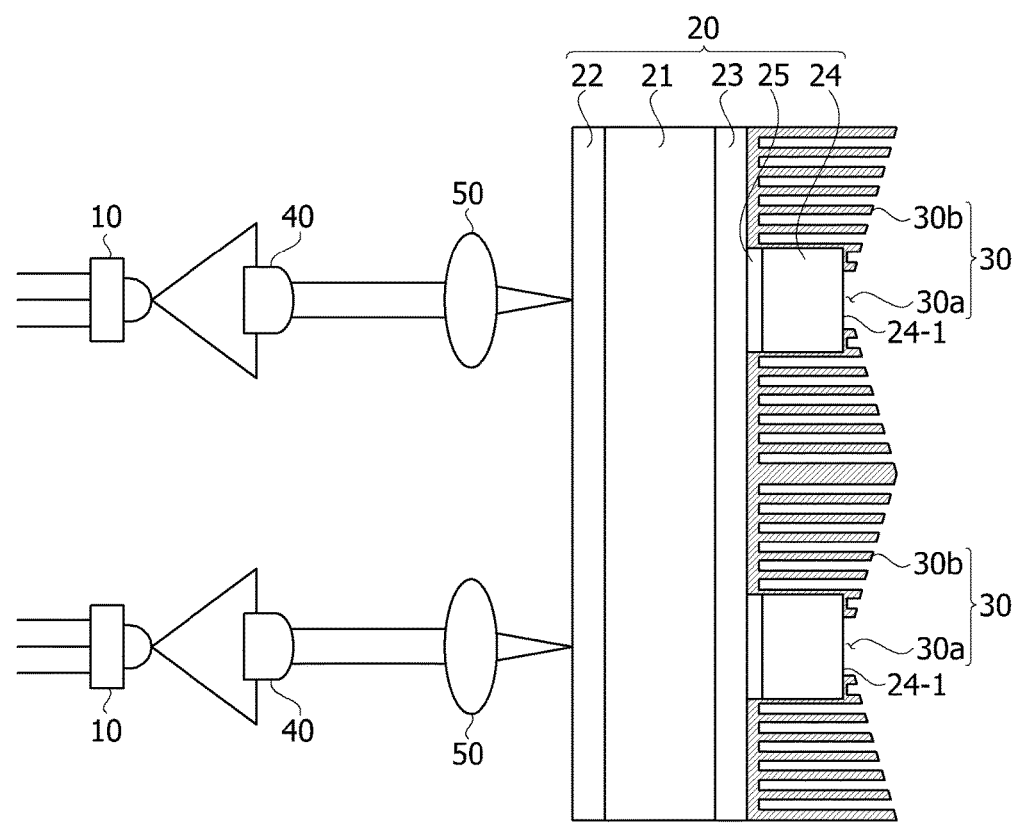
Figure 4C:
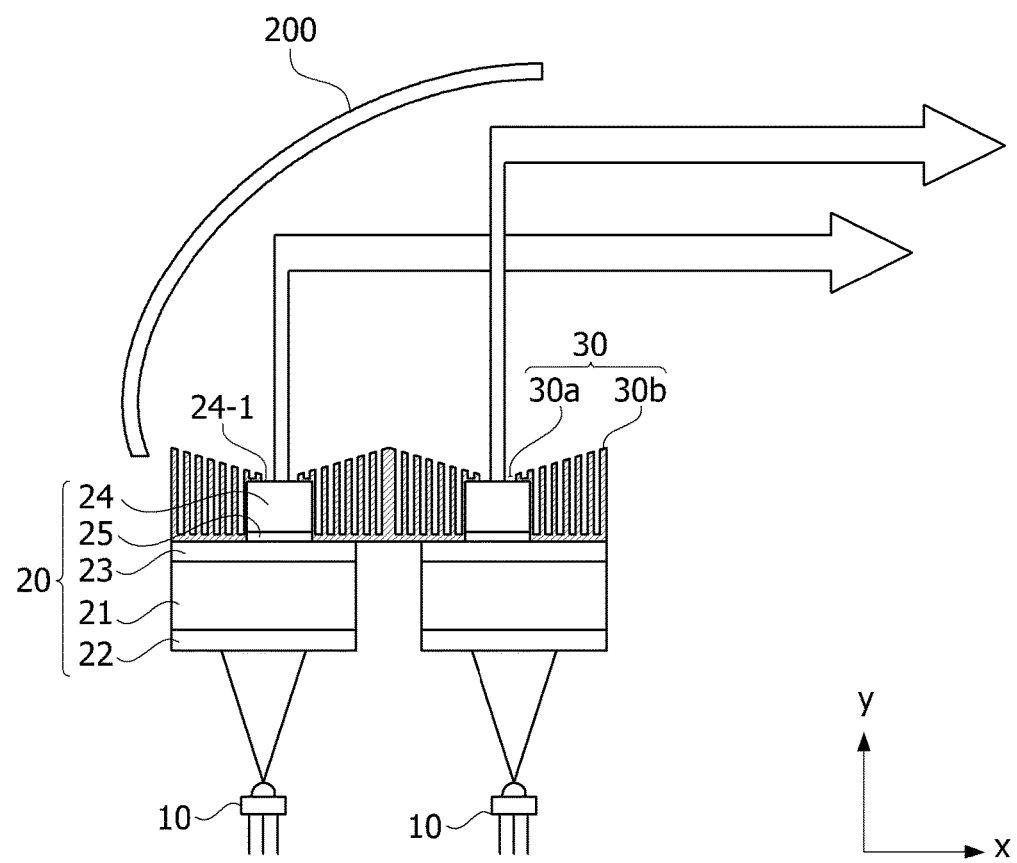

FIGS. 4A to 4C are cross sectional views of a lighting apparatus according to a third embodiment of the present invention.

As shown in FIG. 4A to 4C, two light sources 10 adjacent each other may share the housing 30.

Specifically, as shown in FIGS. 4A and 4B, the two light sources 10 adjacent to each other may share the housing 30, and in this case, the process may be simplified than in the case that the housing 30 is formed individually. Particularly, as shown in FIG. 4A, each of the light conversion unit 20 may individually correspond to the light source 10, or as shown in FIG. 4B, the light conversion unit 20 may be formed integrally. However, independently of whether the light conversion unit 20 is an individual type or an integral type, the phosphor layer 24 and the opening 30a may be provided with the same number and may individually correspond to each other.

As shown in FIG. 4C, the light emitted from the light source 10 may be reflected in a certain direction by a reflecting shade 200, and in the drawings, it is shown that a light in a vertical direction y is reflected to a horizontal direction x.

Particularly, when compared with the embodiments shown in FIGS. 4A and 4B which include the collimator 40 and the light concentrating unit 50 between the light source 10 and the light conversion unit 20, an embodiment shown in FIG. 4C can be easily miniaturized because the collimator 40 and the light concentrating unit 50 have been removed so that the distance between the light source 10 and the light conversion unit 20 is close.

Thus, the embodiment shown in FIG. 4C can be easily applied to a reflecting-type lighting apparatus which includes the reflecting shade 200, and the embodiments shown in FIGS. 4A and 4B can be preferably applied to a direct down-type lighting apparatus in which a light emitted from the light source 10 travels in a horizontal direction x. However, the application is not limited thereto.

Since the lighting apparatus of the present invention as described above, the housing 30 covers up the side surface of the phosphor layer 24, so the housing 30 adjusts light distribution. In other words, the housing 30 prevents deterioration of a color property caused by the light which has the wavelength of yellow light. Also, the housing 30 includes a plurality of slits 30b, performance of radiation of heat is improved.

The embodiments of the present invention as explained above are not limited to the described embodiments and the drawings accompanied, and it will be apparent to those of ordinary skill in the art that it is possible to implement various substitutions, variations and modifications on the present invention without departing from the concept and scope of the present invention.

What is claimed is:

1. A lighting apparatus comprising:
 a light source which generates laser light;
 a light conversion unit which is disposed in a direction that the laser light is emitted, and includes a phosphor layer that generates a converted light which is excited by the laser light; and
 a housing which covers a side surface of the phosphor layer, and is disposed on a light emitting surface of the light conversion unit,
 wherein the housing includes an opening which exposes a first surface of the phosphor layer, and a plurality of slits, and
 wherein the light conversion unit includes:
 a substrate;
 an antireflection coating which is coated on a back side of the substrate;
 a short wavelength filter which is disposed on a front surface of the substrate; and
 the phosphor layer which is disposed on a front surface of the short wavelength filter.

2. The lighting apparatus of claim 1, wherein the light emitting surface corresponds to the first surface of the phosphor layer.

3. The lighting apparatus of claim 1, wherein the housing includes metal selected from Al or Cu, or wherein the housing is a Heat sink.

4. The lighting apparatus of claim 1, wherein the housing is disposed to cover a part of the first surface of the phosphor layer.

5. The lighting apparatus of claim 1, wherein the plurality of slits are disposed to surround a part of the first surface and a side surface of the phosphor layer.

6. The lighting apparatus of claim 1, wherein the slits are extended in a direction which is away from the phosphor layer.

7. The lighting apparatus of claim 1, wherein the plurality of slits are inclined in the direction that the laser light is emitted at a part of the first surface of the phosphor layer.

8. The lighting apparatus of claim 1, wherein the antireflection coating is disposed to face the light source.

9. The lighting apparatus of claim 1, further comprising a metal paste which is disposed on an interface of the housing and the phosphor layer.

10. The lighting apparatus of claim 9, wherein the metal paste includes metal selected from Ag or Cu.

11. The lighting apparatus of claim 1, wherein the first surface of the phosphor layer includes an uneven structure.

12. The lighting apparatus of claim 1, wherein the first surface which is exposed through the opening of the housing has different roughness average from the side surface of the phosphor layer.

13. The lighting apparatus of claim 1, wherein the roughness average of the first surface which is exposed through the opening of the housing is larger than the roughness average of the side surface of the phosphor layer.

14. The lighting apparatus of claim 1, wherein the roughness average of the first surface which is exposed through the opening of the housing is 0.05 μm or less.

15. The lighting apparatus of claim 1, further comprising, a collimator and a light concentrating unit disposed between the light source and the light conversion unit,
 wherein the collimator is disposed closer to the light source than the light concentrating unit.

16. The lighting apparatus of claim 1, wherein the slits are disposed to surround the opening of the housing.

17. The lighting apparatus of claim 1, wherein the opening of the housing has a structure that is inclined so as to have a tilting angle θ which is 90° or less with respect to the light emitting surface of the light conversion unit.

18. The lighting apparatus of claim 1, wherein the opening of the housing is increasingly widened as a distance from the light emitting surface increases.

19. The lighting apparatus of claim 1, wherein the phosphor layer and the opening of the housing correspond to each other.

20. The lighting apparatus of claim 1, wherein the lighting apparatus further includes a reflecting shade which reflects the light emitted from the phosphor layer.

* * * * *